(12) United States Patent
Wilk et al.

(10) Patent No.: US 7,757,363 B2
(45) Date of Patent: Jul. 20, 2010

(54) SUPPORT SYSTEM FOR SEMICONDUCTOR WAFERS

(75) Inventors: Brian Wilk, Portland, OR (US); Frank Joyce, Portland, OR (US); Douglas Kreager, Portland, OR (US); Thomas A. Repko, Dallas, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/399,530

(22) Filed: Apr. 7, 2006

(65) Prior Publication Data

US 2006/0179632 A1 Aug. 17, 2006

Related U.S. Application Data

(62) Division of application No. 10/748,170, filed on Dec. 31, 2003, now Pat. No. 7,055,229.

(51) Int. Cl.
B25B 27/14 (2006.01)
(52) U.S. Cl. .................... 29/281.1; 269/21; 451/388
(58) Field of Classification Search ............... 28/281.1, 28/21; 451/388, 41, 285–288; 29/281.1; 269/21, 20, 289 R; 118/728; 414/744
See application file for complete search history.

(56) References Cited

U.S. PATENT DOCUMENTS

| | | | |
|---|---|---|---|
| 4,535,834 A | 8/1985 | Turner | |
| 4,551,192 A * | 11/1985 | Di Milia et al. | 156/345.51 |
| 4,556,362 A * | 12/1985 | Bahnck et al. | 414/744.3 |
| 4,603,466 A | 8/1986 | Mortley | |
| 5,423,716 A * | 6/1995 | Strasbaugh | 451/388 |
| 5,584,746 A * | 12/1996 | Tanaka et al. | 451/41 |
| 6,012,509 A * | 1/2000 | Nonaka | 165/80.2 |
| 6,056,632 A * | 5/2000 | Mitchel et al. | 451/288 |
| 6,173,948 B1 * | 1/2001 | Hall et al. | 269/21 |
| 6,241,825 B1 * | 6/2001 | Wytman | 118/733 |
| 6,283,693 B1 | 9/2001 | Acello | |
| 6,464,790 B1 | 10/2002 | Sherstinsky et al. | |
| 6,638,391 B1 * | 10/2003 | Hsu et al. | 156/345.12 |
| 6,852,019 B2 | 2/2005 | Togawa et al. | |
| 7,055,229 B2 * | 6/2006 | Wilk et al. | 29/281.1 |
| 7,160,392 B2 * | 1/2007 | Shang et al. | 118/728 |
| 2002/0022082 A1 | 2/2002 | Scott | |
| 2003/0003850 A1 * | 1/2003 | Eaton | 451/41 |

(Continued)

FOREIGN PATENT DOCUMENTS

CN 2218627 Y 1/1996

(Continued)

OTHER PUBLICATIONS

English Translation of Chinese Office Action of Application No. 200480038956.5 dated Jul. 6, 2007.

(Continued)

Primary Examiner—Lee D Wilson
(74) Attorney, Agent, or Firm—Pearl Cohen Zedek Latzer, LLP

(57) ABSTRACT

A semiconductor wafer may be secured to a wafer support system by causing a supported surface of the semiconductor wafer to be at a lower gas pressure than an exposed surface of the semiconductor wafer.

11 Claims, 11 Drawing Sheets

U.S. PATENT DOCUMENTS

| | | |
|---|---|---|
| 2003/0026904 A1 | 2/2003 | Yadav et al. |
| 2003/0037400 A1 | 2/2003 | Hunter et al. |
| 2003/0211813 A1 | 11/2003 | Kassir et al. |
| 2003/0234078 A1 | 12/2003 | Hsu et al. |
| 2006/0179632 A1* | 8/2006 | Wilk et al. .................. 29/281.1 |
| 2008/0035875 A1* | 2/2008 | Tai et al. ..................... 251/318 |

FOREIGN PATENT DOCUMENTS

| | | |
|---|---|---|
| JP | 09-181156 | 7/1997 |
| JP | 2001-093864 | 4/2001 |
| JP | 2002-270571 | 9/2002 |
| JP | 2005-126815 | 5/2005 |
| JP | 2005-175207 | 6/2005 |
| WO | WO 01/07691 | 2/2001 |

OTHER PUBLICATIONS

Office Action for Japanese Application No. 2006-547434 dated Mar. 17, 2009.

Office Action in Japanese application 2006-547434 dated Jul. 29, 2009.

Office Action from Application No. 93115318 dated Oct. 5, 2006.

English language translation of German Office Action, issued Feb. 17, 2010, for German Patent Application No. 112004002610.5-33.

* cited by examiner

SUPPORT SYSTEM FOR SEMICONDUCTOR WAFERS

CROSS REFERENCE TO RELATED APPLICATIONS

This application is a divisional of and claims priority from U.S. patent application Ser. No. 10/748,170, filed on Dec. 31, 2003 now U.S. Pat. No. 7,055,229 and entitled "Support Systems for Semiconductor Wafers and Methods Thereof", the entirety of which is incorporated herein by reference.

BACKGROUND OF THE INVENTION

A semiconductor wafer goes through different processes before its individual dies are packaged. A non-exhaustive list of examples for such processes are wafer back side grinding, wafer back side metallization, wafer dicing by laser and saw, testing, good die marking, die ejection and die placement on a tape. The wafer may need to be mechanically supported during processing. The wafer may also need to be transported between process tools in a fabrication plant (FAB) or a packaging facility.

A semiconductor wafer may have a diameter of, for example, 300 millimeters, and a thickness of, for example, 762 micrometers. After back side grinding, the wafer thickness may be reduced, for example, to a thickness in the range of approximately 50 to approximately 100 micrometers. A wafer with such a thickness may be fragile and may require careful handling.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

Figure 1:
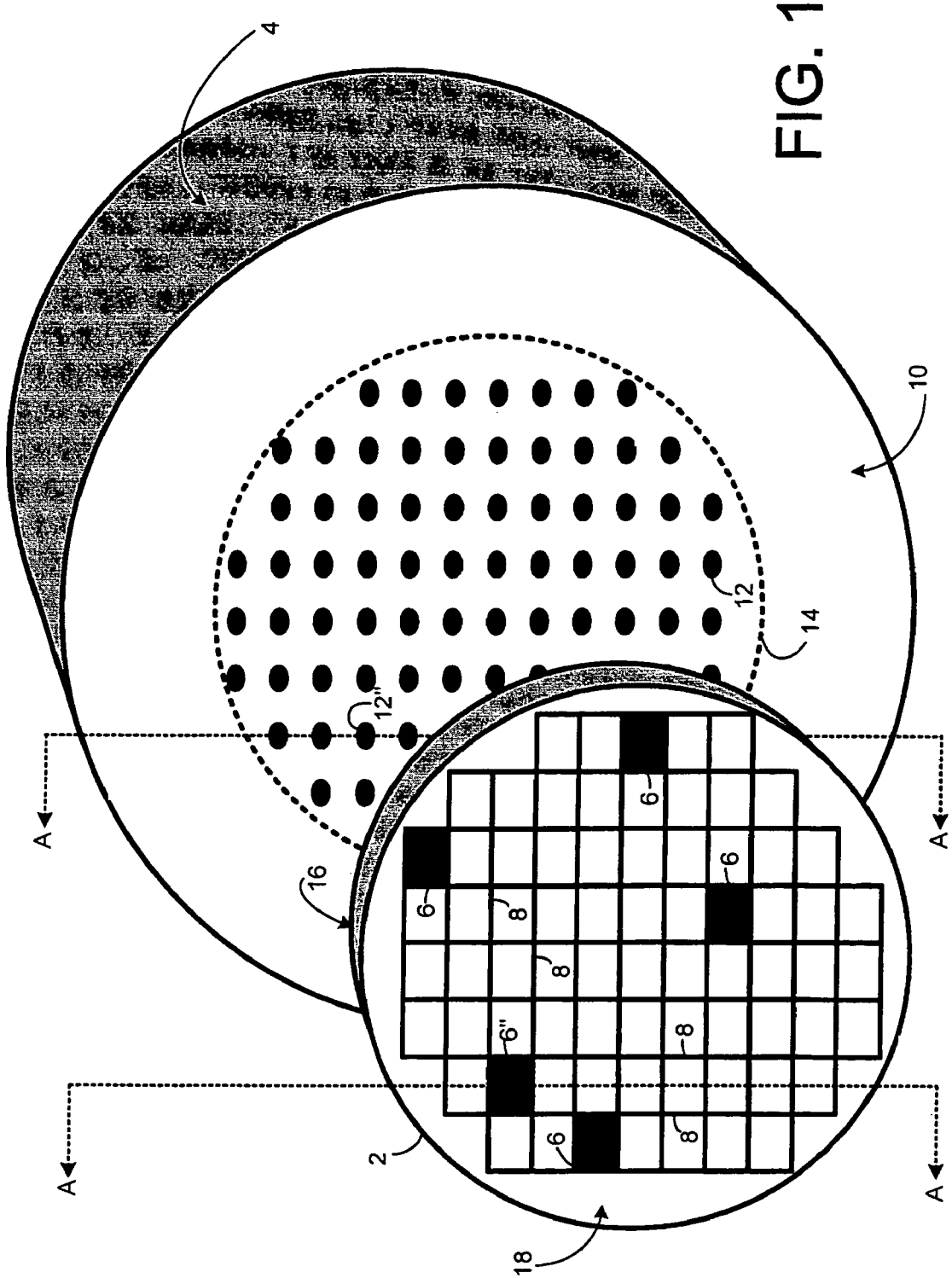
FIG. 1 is an exploded view of an exemplary semiconductor wafer and an exemplary wafer support system, in accordance with some embodiments of the invention.
Figure 2:
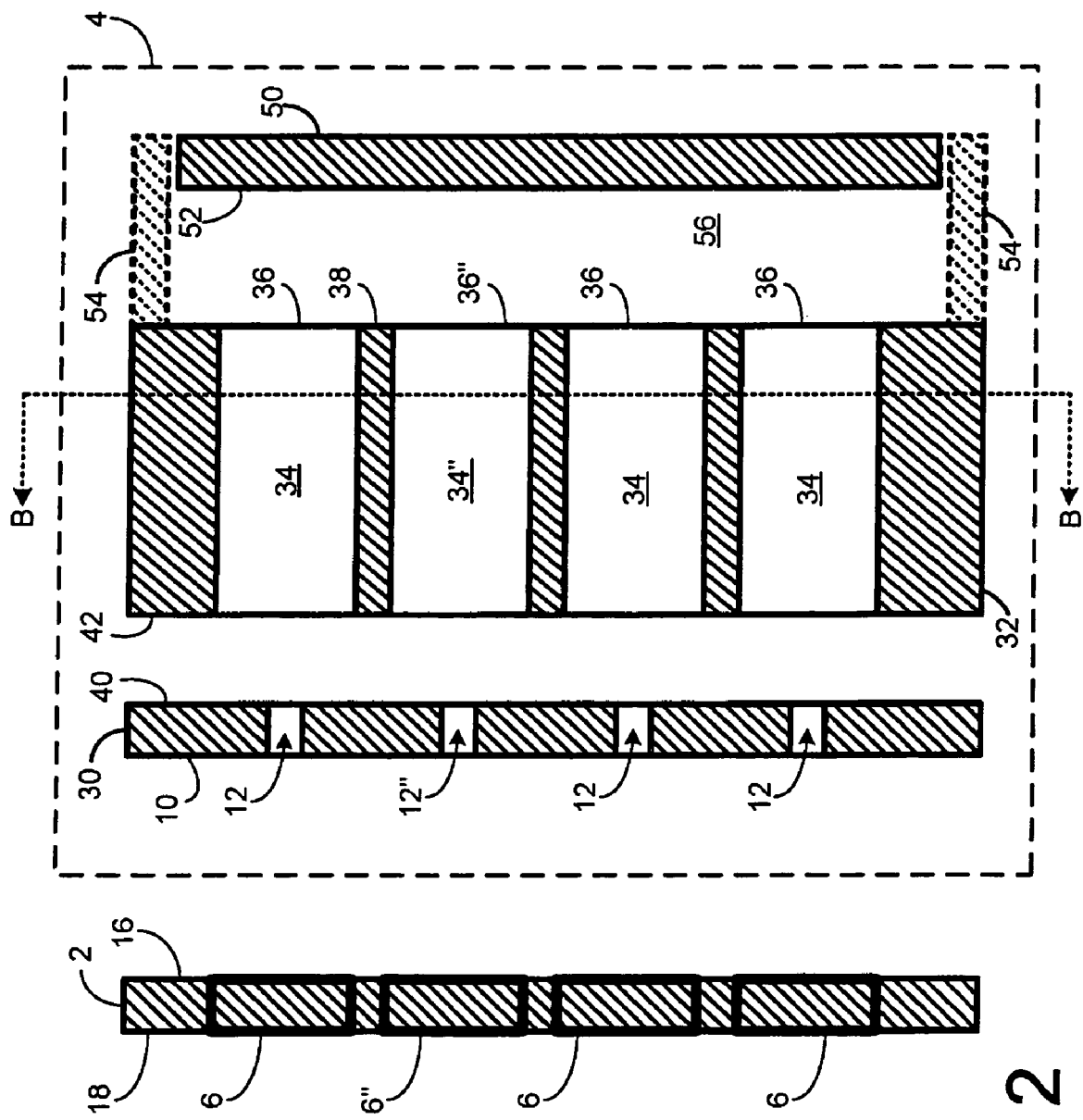
FIG. 2 is a cross-sectional view of part of the semiconductor wafer of FIG. 1 and part of the wafer support system of FIG. 1, in accordance with some embodiments of the invention.
Figure 3:
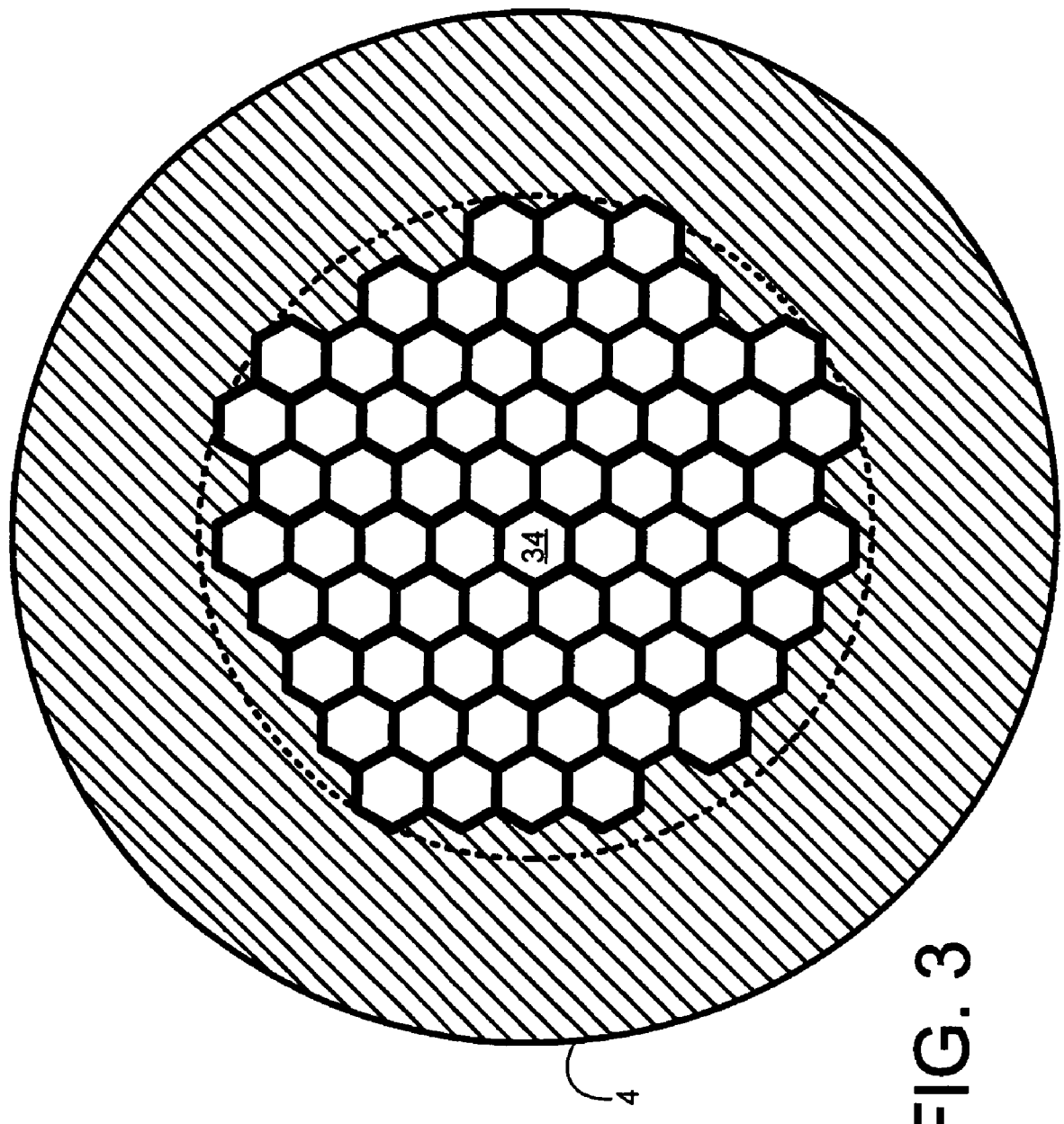
FIG. 3 is a cross-sectional view of part of the wafer support system of FIG. 1, in accordance with some embodiments of the invention.

Referring to FIG. 1 and FIG. 2, an exemplary semiconductor wafer 2 and a wafer support system 4 in accordance with some embodiments of the invention is illustrated. FIG. 1 is an exploded view of semiconductor wafer 2 and wafer support system 4, while FIG. 2 is a cross-sectional view of part of semiconductor wafer 2 and part of wafer support system 4 along a cross-section A, and FIG. 3 is a cross-sectional view of part of wafer support system 4 along a cross-section B.

As shown in FIG. 1, semiconductor wafer 2 may have a disk shape, although any other shape of semiconductor wafer 2 is also contemplated. Semiconductor wafer 2 may include dies, such as exemplary dies 6, separated by scribe lines (also known as "streets"), such as exemplary scribe lines 8. Dies 6 may have a rectangular shape, although any other shape of dies 6 is also contemplated. Moreover, although not shown explicitly in FIG. 1, semiconductor wafer 2 may include dies of different shapes and sizes.

Semiconductor wafer 2 may go through different processes, such as, for example, surface grinding and surface metallization. In addition, particular dies 6, such as for example, the die denoted 6", may be sawed out of semiconductor wafer 2 by, for example, a laser saw or a mechanical saw. Sawed die 6" may be ejected from semiconductor wafer 2 and may be placed on a tape (not shown).

A non-exhaustive list of examples for the diameter of semiconductor wafer 2 includes approximately 150 millimeters, approximately 200 millimeters and approximately 300 millimeters. Semiconductor wafer 2 may have a thickness in the range, for example, of approximately 700 micrometers to approximately 800 micrometers, such as, for example, a thickness of approximately 762 micrometers. A surface grinding process may reduce the thickness of semiconductor wafer 2 to a thickness in the range, for example, of approximately 50 to approximately 100 micrometers.

Wafer support system 4 may have a substantially rigid perforated surface 10 having openings 12. Openings 12 may be concentrated in an area defined by a curve 14 having substantially the same shape as semiconductor wafer 2. Openings 12 may have a substantially round shape, although any other shape of openings 12 is also contemplated.

Semiconductor wafer 2 may be secured to wafer support system 4 by placing a supported surface 16 of semiconductor wafer 2 in contact with perforated surface 10 so that openings 12 are substantially blocked by semiconductor wafer 2, and in addition, by causing an exposed surface 18 of semiconductor wafer 2 to be at a gas pressure higher than a gas pressure applied to supported surface 16 through openings 12.

While semiconductor wafer 2 is secured to wafer support system 4, semiconductor wafer 2 may be transported together with wafer support system 4. Moreover, while semiconductor wafer 2 is secured to wafer support system 4, processes such as, for example, wafer back side grinding, wafer back side metallization, wafer dicing by laser and saw, testing, good die marking, die ejection and die placement on a tape, may be applied to semiconductor wafer 2. The rigidity of perforated surface 10 may reduce or eliminate flexing of semiconductor wafer 2 during handling, transporting and processing.

Secured semiconductor wafer 2 may be released from wafer support system 4 by causing exposed surface 18 to be at a gas pressure lower than or substantially equal to the gas pressure applied to supported surface 16 through openings 12.

Moreover, one or more sawed dies of secured semiconductor wafer 2, such as, for example, die 6", may be released from wafer support system 4 by increasing the gas pressure applied to supported surface 16 through openings that are blocked by those sawed dies, for example, opening 12", while maintaining the gas pressure applied to supported surface 16 through other openings 12. Sawed die 6", after being released from wafer support system 4, may be separated from wafer support system 4 by a die picking tool (not shown). Since there is no adhesive holding sawed die 6" to wafer support system 4, the removal of sawed die 6" with a die picking tool does not involve the pulling, peeling or prying generally required to remove a die from an adhesive surface.

As shown in FIG. 2, wafer support system 4 may include a first part that is a substantially rigid perforated plate 30 having perforated surface 10 and openings 12. In addition, wafer support system 4 may include a second part 32 having multiple cavities 34.

As shown in FIG. 3, cavities 34 may be arranged in a honeycomb structure, although any other arrangement of cavities is also contemplated. For example, cavities 34 may have a hexagonal shape, although any other shape of cavity 34, such as, for example, a rectangle, a circle, and the like is also contemplated.

According to a first embodiment of the invention, for every opening 12 in perforated plate 30, part 32 may have a corresponding cavity 34. For example, a cavity 34" may correspond to opening 12".

According to a second embodiment of the invention, for every opening 12 in perforated plate 30, part 32 may have multiple corresponding cavities 34. According to a third embodiment of the invention, for every cavity 34 in part 32, perforated plate 30 may have multiple openings 12.

The number, size, shape and arrangement of cavities 34 may be chosen to suit the arrangement of dies on the semiconductor wafer. In addition, a smallest of cavities 34 may be substantially equivalent in area to an area of a smallest of dies on semiconductor wafer 2.

Cavities 34 may have orifices 36 on a surface 38 of part 32. According to one embodiment of the invention, a cavity 34 may have one corresponding orifice 36. According to a second embodiment of the invention, a cavity 34 may have more than one corresponding orifice 36.

Perforated plate 30 and part 32 may be attached so that a surface 40 of perforated plate 30 and a surface 42 of part 32 are touching. Alternatively, perforated plate 30 and part 32 may be manufactured as a single body having surface 10 with openings 12 and an opposite surface 38 with orifices 36, where the openings and orifices are joined by cavities.

Gas may be substantially trapped inside cavities 34 if
a. supported surface 16 of semiconductor wafer 2 is in contact with perforated surface 10 so that openings 12 are substantially blocked by semiconductor wafer 2, with perforated plate 30 functioning substantially as a gasket between supported surface 16 and surface 42 of part 32, and b. a membrane 50 is attached to part 32 so that orifices 36 are substantially sealed.

Gas trapped in cavities 34 may apply force to supported surface 16 through openings 12. In addition, gas that is external to cavities 34 may apply force to exposed surface 18.

Figure 4:
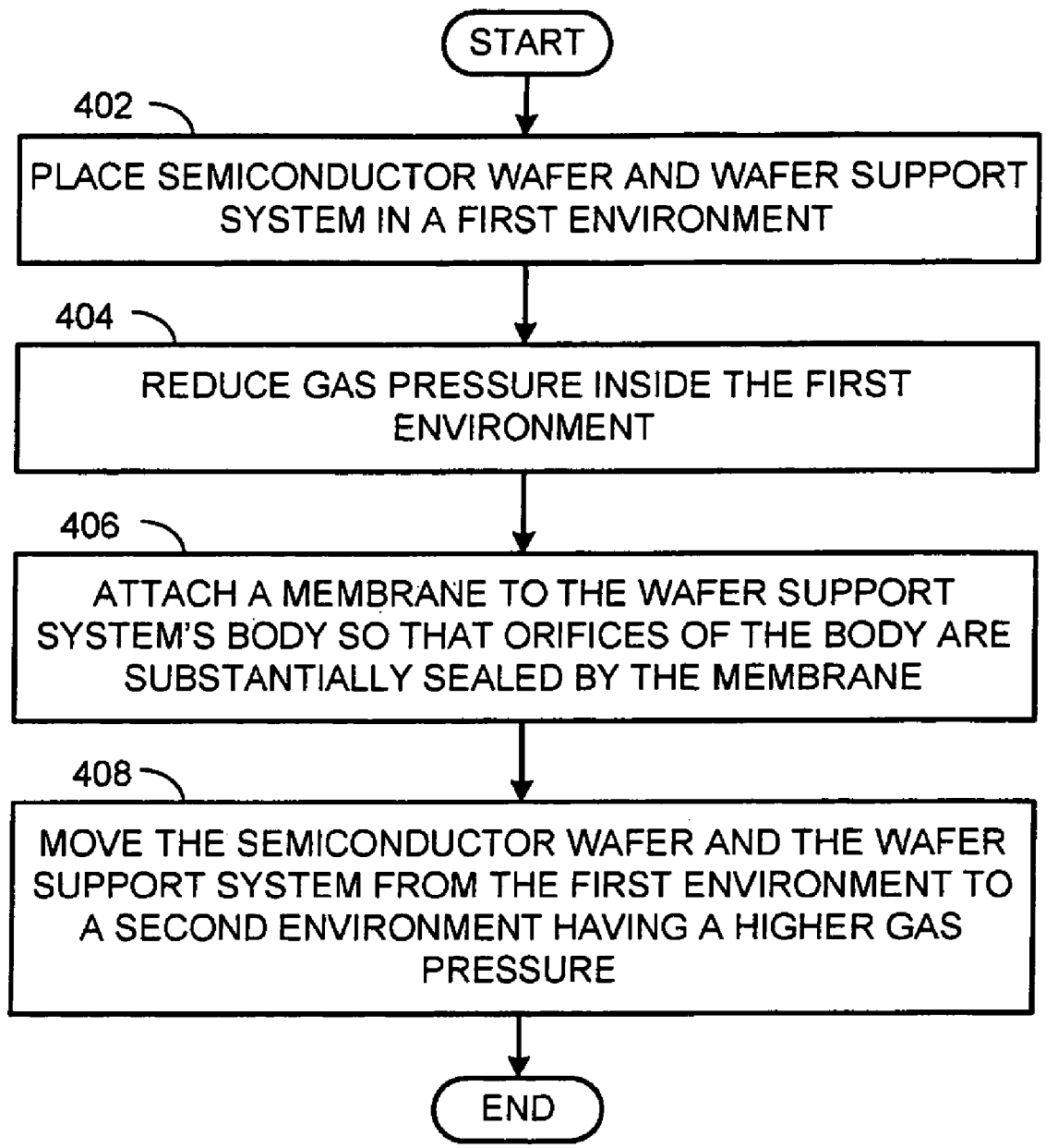
FIG. 4 is a flowchart illustration of a method for securing a semiconductor wafer to a wafer support system, in accordance with some embodiments of the invention.

FIG. 4 is a flowchart illustration of a method for securing semiconductor wafer 2 to wafer support system 4, in accordance with some embodiments of the invention. Semiconductor wafer 2 and wafer support system 4 may be placed in a first environment, for example, a vacuum chamber, with supported surface 16 placed in contact with perforated surface 10 so that openings 12 are substantially blocked (-402-). The gas pressure inside the first environment may be reduced (-404-). Membrane 50 may be attached to part 32 so that orifices 36 are substantially sealed (-406-). Then, wafer support system 4 and semiconductor wafer 2 may be removed from the first environment to a second environment at a gas pressure higher than the gas pressure inside the first environment (-408-). Consequently, the gas pressure inside cavities 34 may be lower than the gas pressure on exposed surface 18.

Figure 5:
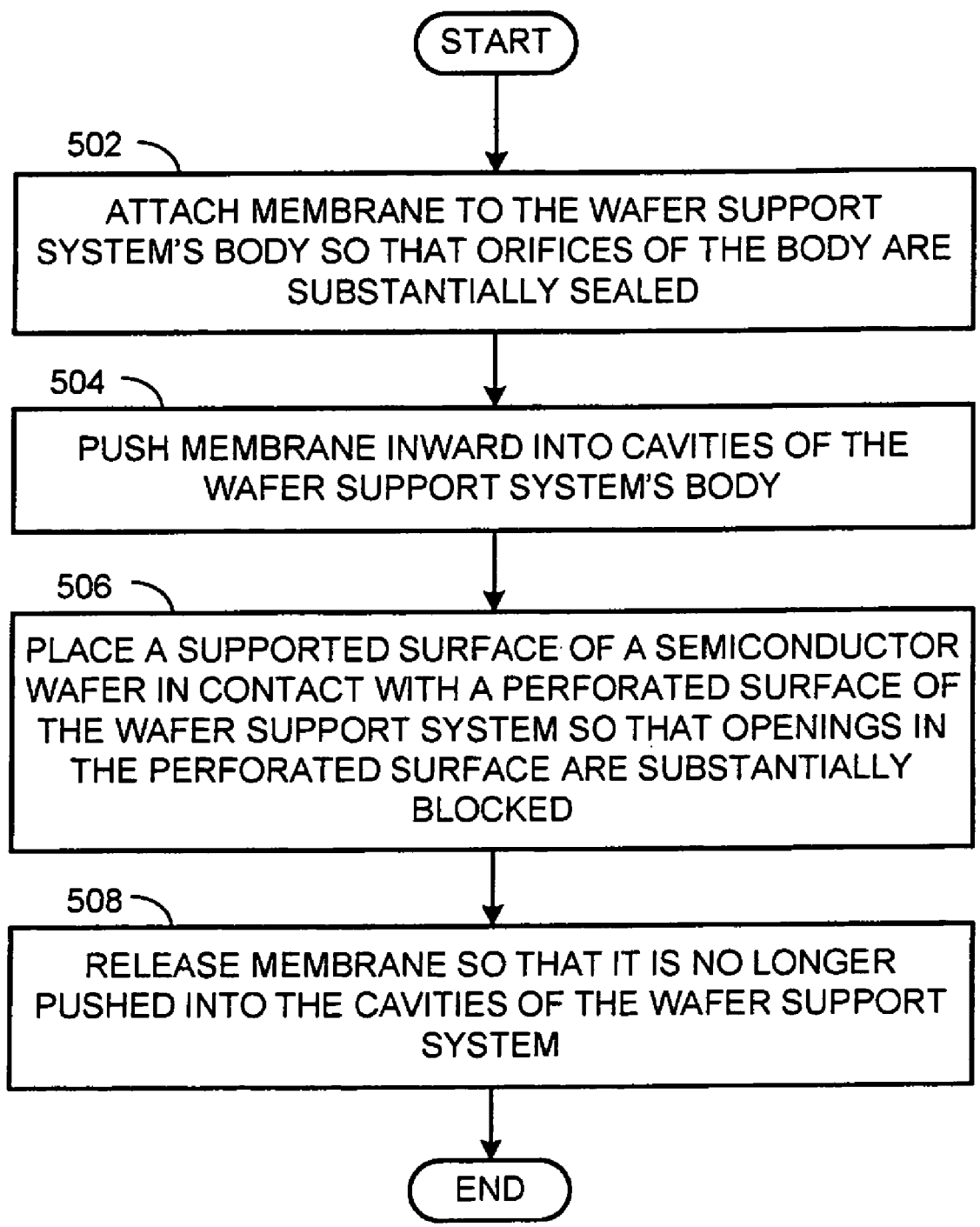
FIG. 5 is a flowchart illustration of another method for securing a semiconductor wafer to a wafer support system, in accordance with some embodiments of the invention.

FIG. 5 is a flowchart illustration of another method for securing semiconductor wafer 2 to wafer support system 4, in accordance with some embodiments of the invention. Membrane 50 may be flexible and may be attached to part 32 so that orifices 36 are substantially sealed (-502-). Membrane 50 may be pushed inwards into cavities 34 (-504-). Then, supported surface 16 may be placed in contact with perforated surface 10 so that openings 12 are substantially blocked (-506-), and membrane 50 may be released so it is no longer pushed into cavities 34 (-508-). Consequently, the gas pressure inside cavities 34 may be lower than the gas pressure on exposed surface 18.

Figure 6:
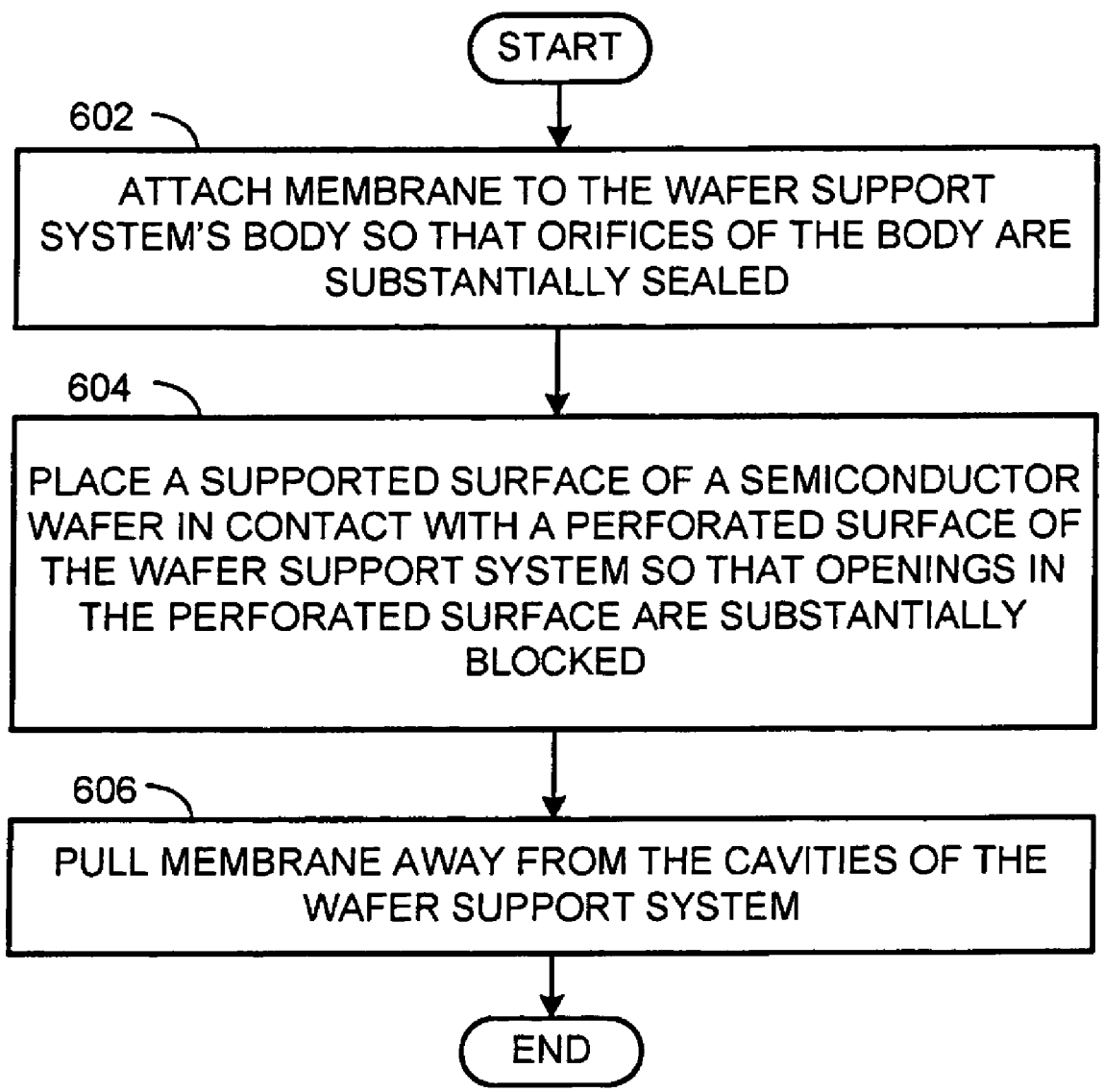
FIG. 6 is a flowchart illustration of yet another method for securing a semiconductor wafer to a wafer support system, in accordance with some embodiments of the invention.

FIG. 6 is a flowchart illustration of another method for securing semiconductor wafer 2 to wafer support system 4, in accordance with some embodiments of the invention. In some embodiments of the invention, part 32 may optionally have perimeter walls 54, extending beyond surface 38, and membrane 50 may be rigid. Membrane 50 may be attached to part 32 so that orifices 36 are substantially sealed (-602-). Supported surface 16 may be placed in contact with perforated surface 10 so that openings 12 are substantially blocked (-604-). Then, membrane 50 may be pulled away from surface 38 so membrane 50 is still within perimeter walls 54 to form a void 56 (-606-). Void 56 and cavities 34 may be sealed by membrane 50 and perimeter walls 54. Consequently, the gas pressure inside cavities 34 and void 56 may be lower than the gas pressure on exposed surface 18.

Figure 7:
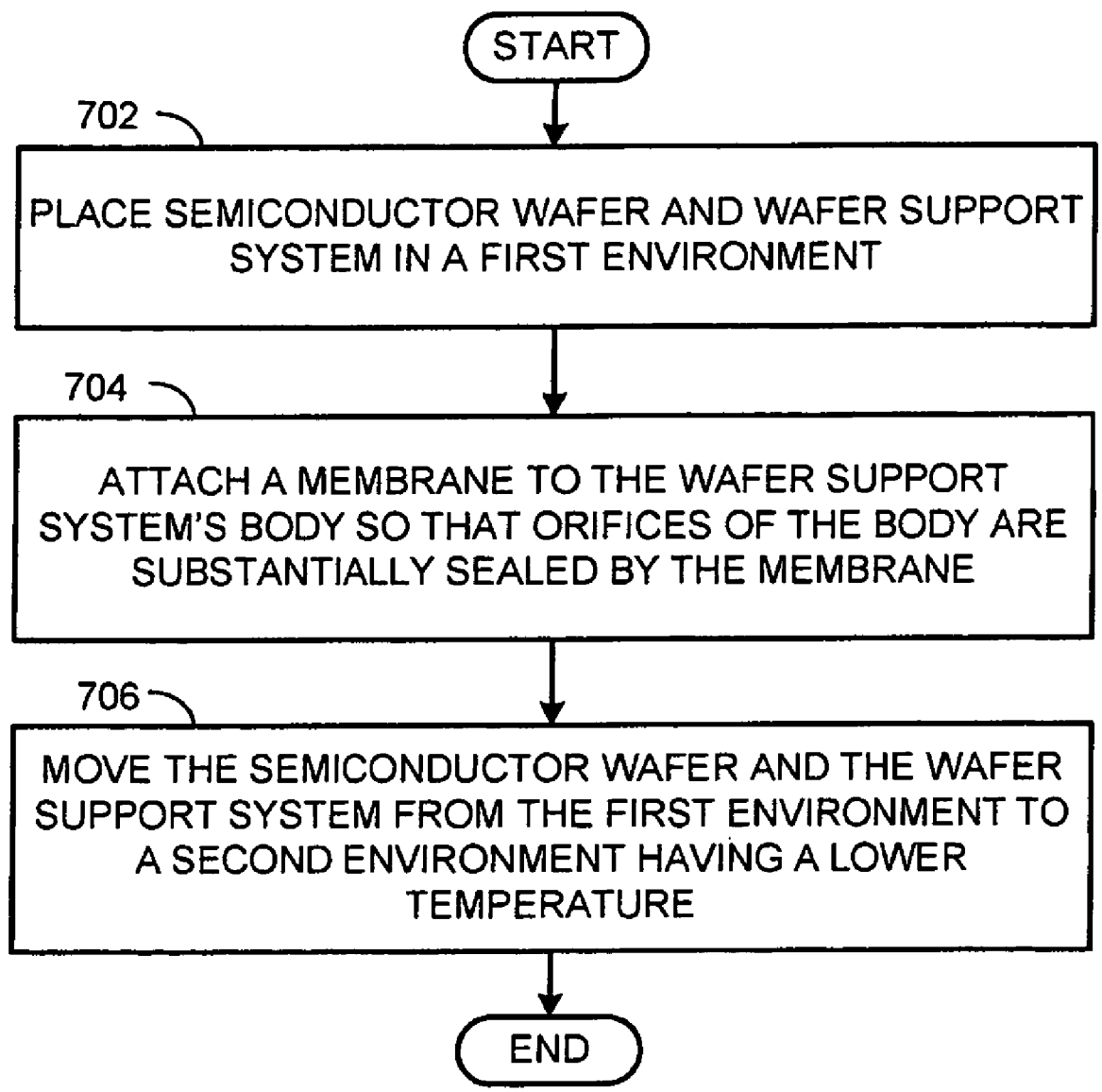
FIG. 7 is a flowchart illustration of a further method for securing a semiconductor wafer to a wafer support system, in accordance with some embodiments of the invention.

FIG. 7 is a flowchart illustration of a further method for securing semiconductor wafer 2 to wafer support system 4, in accordance with some embodiments of the invention. Semiconductor wafer 2 and wafer support system 4 may be placed in a first environment at a first temperature, with supported surface 16 placed in contact with perforated surface 10 so that openings 12 are substantially blocked (-702-). Membrane 50 may be attached to part 32 so that orifices 36 are substantially sealed (-704-). Then, wafer support system 4 and semiconductor wafer 2 may be removed from the first environment to a second environment at a second temperature that is lower than the first temperature (-706-). Since the air in the first environment is less dense than that in the second environment, once wafer support system 4 and semiconductor wafer 2 are in the second environment, the air pressure inside cavities 34 may be lower than the air pressure on exposed surface 18.

FIGS. 8A, 8B, 8C and 8D are flowchart illustrations of alternate methods for releasing semiconductor wafer 2 from wafer support system 4, in accordance with some embodiments of the invention.

Figure 8A:
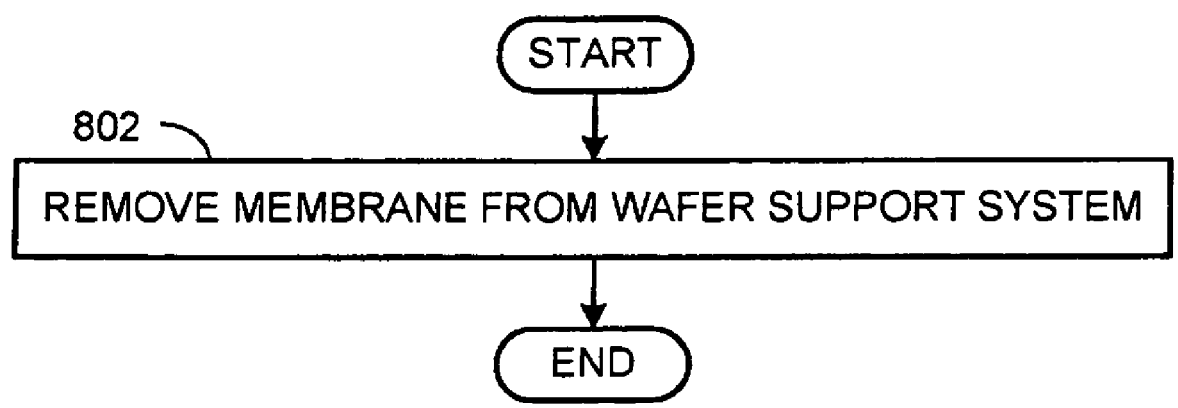
FIGS. 8A, 8B, 8C and 8D are flowchart illustrations of alternate methods for releasing a semiconductor wafer from a wafer support system, in accordance with some embodiments of the invention.

In FIG. 8A, membrane 50 may be removed from wafer support system 4 (-802-) to cause the gas pressure inside cavities 34 to become substantially equal to the gas pressure on exposed surface 18, thus releasing semiconductor wafer 2 from wafer support system.

Figure 8B:
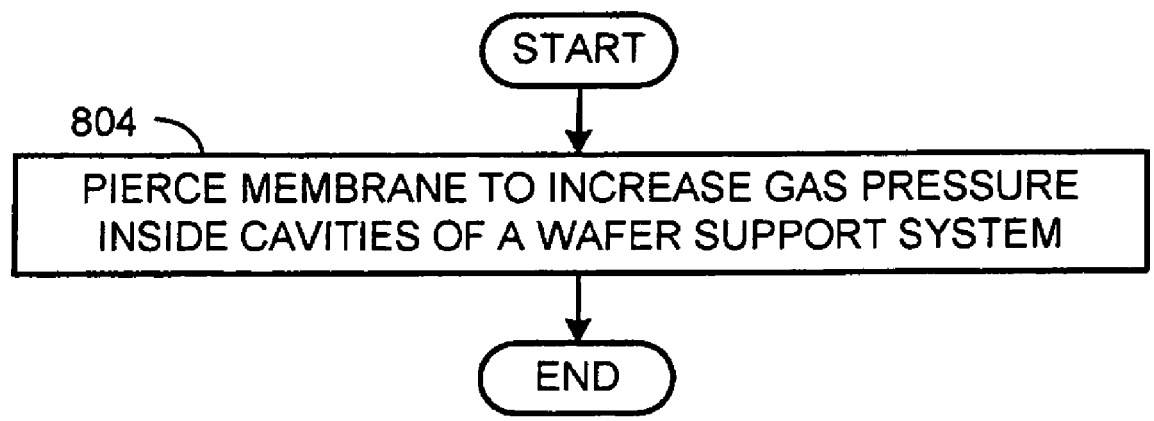

In FIG. 8B, membrane 50 may be pierced (-804-), and the gas pressure inside cavities 34 may become equal to the gas pressure on exposed surface 18. In a modified version of this method, one or more sawed dies may be individually released from wafer support system 4. For example, sawed die 6″ may be individually released from wafer support system 4 by piercing flexible membrane 50 into orifice 36″ in such a way that the gas pressure in cavity 34″ may become equal or higher than the gas pressure surrounding wafer support system 4, and the gas pressure in the other cavities 34 may not be affected.

Figure 8C:
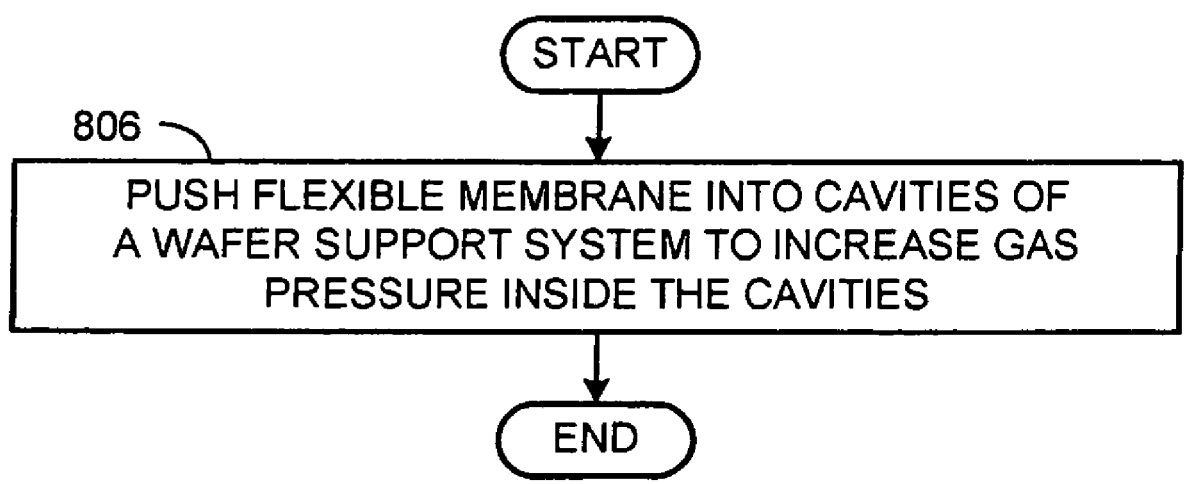

In FIG. 8C, if membrane 50 is flexible, membrane 50 may be pushed inwards into cavities 34 (-806-), and the gas pressure inside cavities 34 may become equal or higher than the gas pressure on exposed surface 18. In a modified version of this method, one or more sawed dies may be individually released from wafer support system 4. For example, sawed die 6″ may be individually released from wafer support system 4 by pushing flexible membrane 50 into orifice 36″ in such a way that the gas pressure in cavity 34″ may become equal or higher than the gas pressure surrounding wafer support system 4, and the gas pressure in the other cavities 34 may not be affected.

Figure 8D:
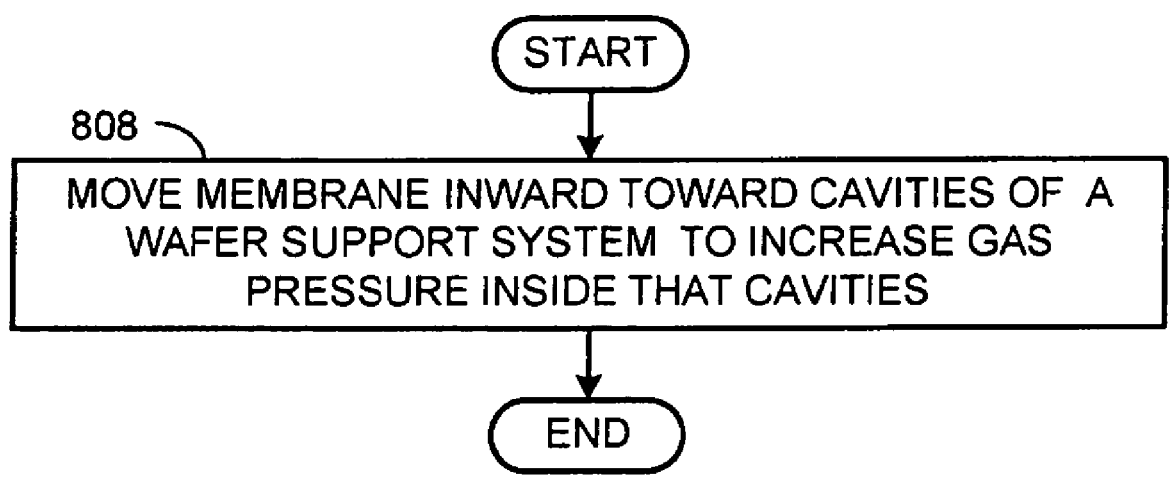

FIG. 8D is applicable, for example, in the event that part 32 has perimeter walls 54 extending beyond surface 38 and membrane 50 is rigid membrane. Membrane 50 may be moved inwards toward surface 38 (-808-). The gas pressure inside cavities 34 and void 56 may increase and may become equal or higher than the gas pressure on exposed surface 18.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A system comprising:
   a semiconductor wafer; and
   a wafer support system, the wafer support system comprising:
   a first body comprising one or more openings extending through the first body from a first surface to a second surface thereof, the first surface supporting the semiconductor wafer;
   a second body adjacent to said second surface of said first body, wherein the second body comprises one or more cavities, the one or more cavities trapping gas pressure when sealed, wherein said one or more cavities have orifices extending through the second body from a side adjacent to said second surface to a side opposite said second surface; and
   a flexible membrane attached to said opposite side, wherein when said flexible membrane is pushed into said cavities said orifices are sealed.

2. The system of claim 1, wherein said first body and said second body form an integral unit.

3. The system of claim 1, wherein said first and second bodies are separable.

4. The system of claim 1, wherein said conductor wafer comprises dies and said one or more cavities are arranged to correspond with an arrangement of said dies on the semiconductor wafer.

5. The system of claim 4, wherein a smallest of said cavities is substantially equivalent in area to an area of a smallest of dies on said semiconductor wafer.

6. The system of claim 1, wherein a number of said cavities substantially equals a number of said openings.

7. The system of claim 6, wherein said cavities are arranged to provide fluid communication between said openings on said first surface and said orifices on said opposite side.

8. The system of claim 1, wherein said flexible membrane and said one or more cavities are arranged to allow unsealing of individual ones of said orifices on said opposite side.

9. The system of claim 1, wherein said flexible membrane is removable.

10. The system of claim 1, wherein said first surface is rigid.

11. The system of claim 1, wherein an area of each of said cavities is larger than an area of a corresponding opening of the first surface.

\* \* \* \* \*